(12) United States Patent
Gardiner et al.

(10) Patent No.: US 10,503,127 B2
(45) Date of Patent: *Dec. 10, 2019

(54) METHOD FOR SAFE CONTROL OF GAS DELIVERY TO AN ELECTRON MICROSCOPE SAMPLE HOLDER

(71) Applicant: PROTOCHIPS, INC., Morrisville, NC (US)

(72) Inventors: Daniel S. Gardiner, Wake Forest, NC (US); John Damiano, Jr., Apex, NC (US); David P. Nackashi, Raleigh, NC (US); William Bradford Carpenter, Asheville, NC (US); James Rivenbark, Raleigh, NC (US); Mark Uebel, Morrisville, NC (US); Michael Zapata, III, Cary, NC (US); Rebecca Thomas, Valparaiso, IN (US); Franklin Stampley Walden, II, Raleigh, NC (US)

(73) Assignee: PROTOCHIPS, INC., Morrisville, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 15/919,575

(22) Filed: Mar. 13, 2018

(65) Prior Publication Data

US 2018/0203423 A1    Jul. 19, 2018

Related U.S. Application Data

(63) Continuation of application No. 14/816,332, filed on Aug. 3, 2015, now Pat. No. 9,915,926.

(Continued)

(51) Int. Cl.
*G05D 7/00* (2006.01)
*G05B 9/02* (2006.01)
*H01J 37/20* (2006.01)
*G05D 7/06* (2006.01)
*G01M 3/32* (2006.01)
*H01J 37/18* (2006.01)

(52) U.S. Cl.
CPC ............ *G05B 9/02* (2013.01); *G01M 3/3272* (2013.01); *G05D 7/0635* (2013.01); *H01J 37/20* (2013.01); *H01J 37/18* (2013.01); *H01J 2237/006* (2013.01); *H01J 2237/182* (2013.01); *H01J 2237/2002* (2013.01); *H01J 2237/2007* (2013.01); *H01J 2237/2802* (2013.01)

(58) Field of Classification Search
CPC ..... G05B 9/02; G05D 7/0635; G01M 3/3272; H01J 2237/2007; H01J 2237/2802
See application file for complete search history.

(56) References Cited

U.S. PATENT DOCUMENTS 4,989,160 A    1/1991 Garrett et al.
4,998,434 A    3/1991 Asbra
(Continued)

OTHER PUBLICATIONS

Netherlands Enterprise Agency,Search Report and Written Opinion, Netherlands Patent Application No. NL2015258 dated Jul. 13, 2016, pp. 1-14.

(Continued)

*Primary Examiner* — Mark A Connolly
(74) *Attorney, Agent, or Firm* — NK Patent Law

(57) ABSTRACT

System and method for safely controlling the containment of gas within a manifold system and the delivery of gas to a sample holder for an electron microscope for imaging and analysis.

15 Claims, 17 Drawing Sheets

Related U.S. Application Data

(60) Provisional application No. 62/032,612, filed on Aug. 3, 2014.

(56) References Cited

U.S. PATENT DOCUMENTS

| | | |
|---|---|---|
| 5,440,477 A | 8/1995 | Rohrberg et al. |
| 6,682,313 B1 | 1/2004 | Sulmone |
| 7,442,452 B2 | 10/2008 | Miura |
| 7,581,431 B2 | 9/2009 | Yoshida |
| 8,829,469 B2 | 9/2014 | Damiano, Jr. et al. |
| 9,721,752 B2 | 8/2017 | Nagakubo et al. |
| 2006/0207314 A1 | 9/2006 | Kitazawa et al. |
| 2008/0105310 A1 | 5/2008 | Ogami et al. |
| 2010/0077873 A1 | 4/2010 | Kishita et al. |
| 2011/0250740 A1 | 10/2011 | Tikovsky et al. |
| 2012/0025103 A1 | 2/2012 | Deshmukh et al. |
| 2012/0305769 A1 | 12/2012 | Yaguchi et al. |
| 2012/0318047 A1 | 12/2012 | Cunningham et al. |
| 2013/0040400 A1 | 2/2013 | Konings et al. |
| 2014/0014742 A1 | 1/2014 | Kruger et al. |
| 2014/0043289 A1 | 2/2014 | Stern |

OTHER PUBLICATIONS

Creemer, J. Fredrik, et al., A MEMS Reactor for Atomic-Scale Microscopy of Nanomaterials Under Industrially Relevant Conditions, Journal of Microeletromechanical Systems, Apr. 2010, pp. 254-264, vol. 19, No. 2.

Xin, Huolin L., et al., In Situ TEM Study of Catalytic Nanoparticle Reactions in Atmospheric Pressure Gas Environment, Microscopy and Microanalysis, Dec. 2013, pp. 1558-1568, XP-001585594, Microscopy Society of America 2013.

WIPO, International Preliminary Report on Patentability for PCT Patent Application No. PCT/US2015/043381, dated Feb. 7, 2017.

PCT, International Search Report and Written Opinion in International Application No. PCT/US2015/043381 dated Nov. 30, 2015.

USPTO, Office Action in U.S. Appl. No. 14/816,332 dated Aug. 8, 2017.

USPTO, Notice of Allowance in U.S. Appl. No. 14/816,332 dated Dec. 6, 2017.

R. Ubic, Standard Operating Procedure, Hitachi S-3400N-II Scanning Electron Microscope (SEM), Nov. 7, 2011, pp. 1-8.

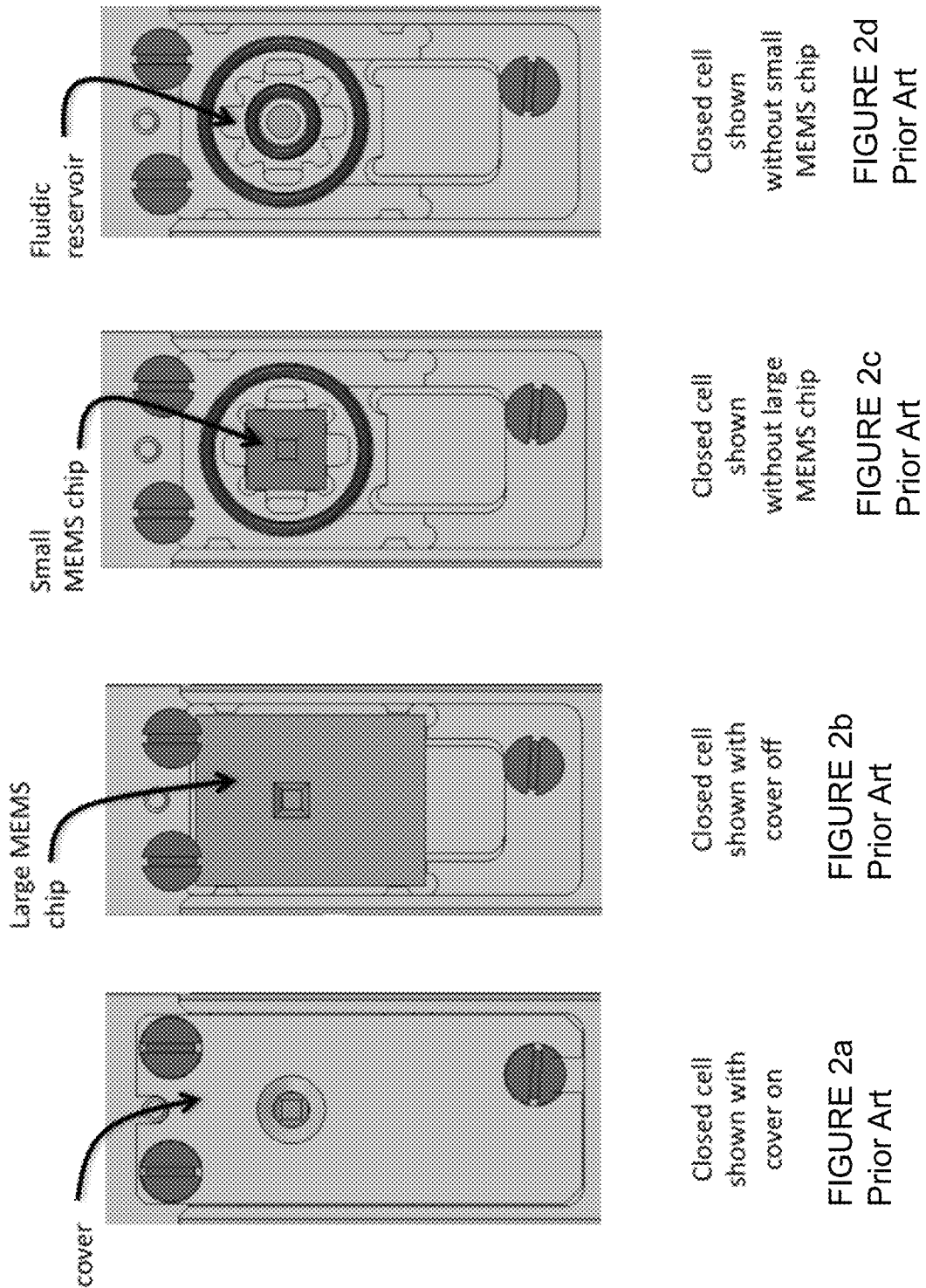

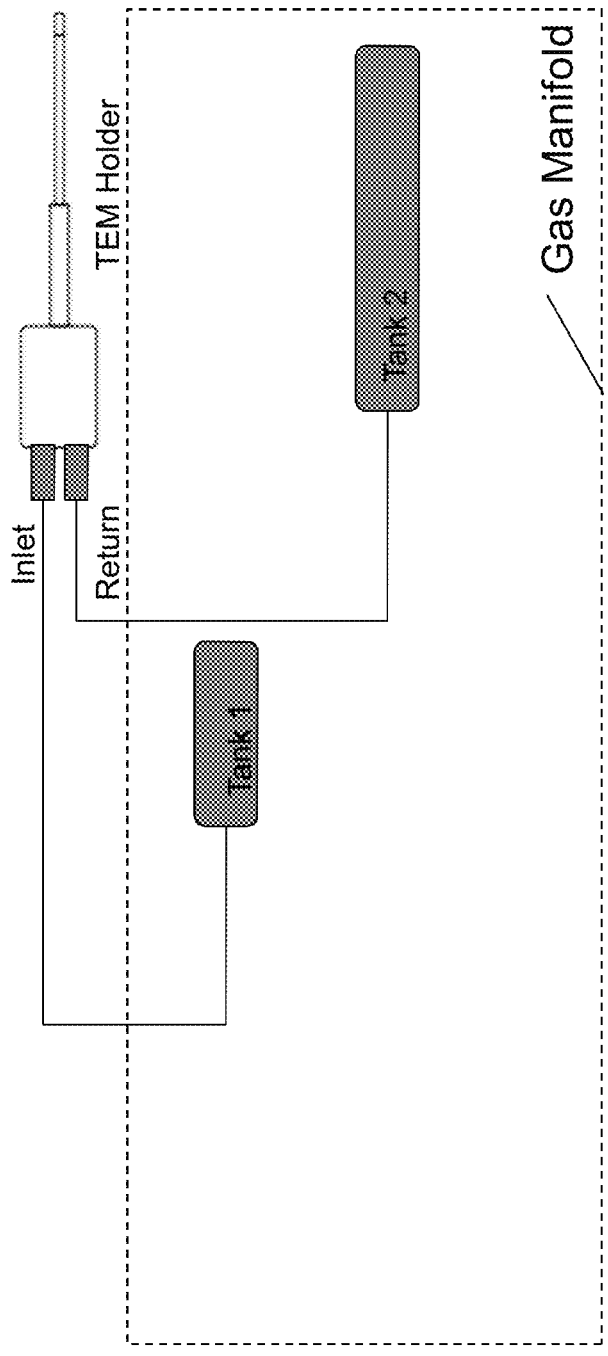
Figure 3a - Gas Flow System with two tanks:
Symbols
Solenoid Valve: ✗
Pressure Gage: ⊖

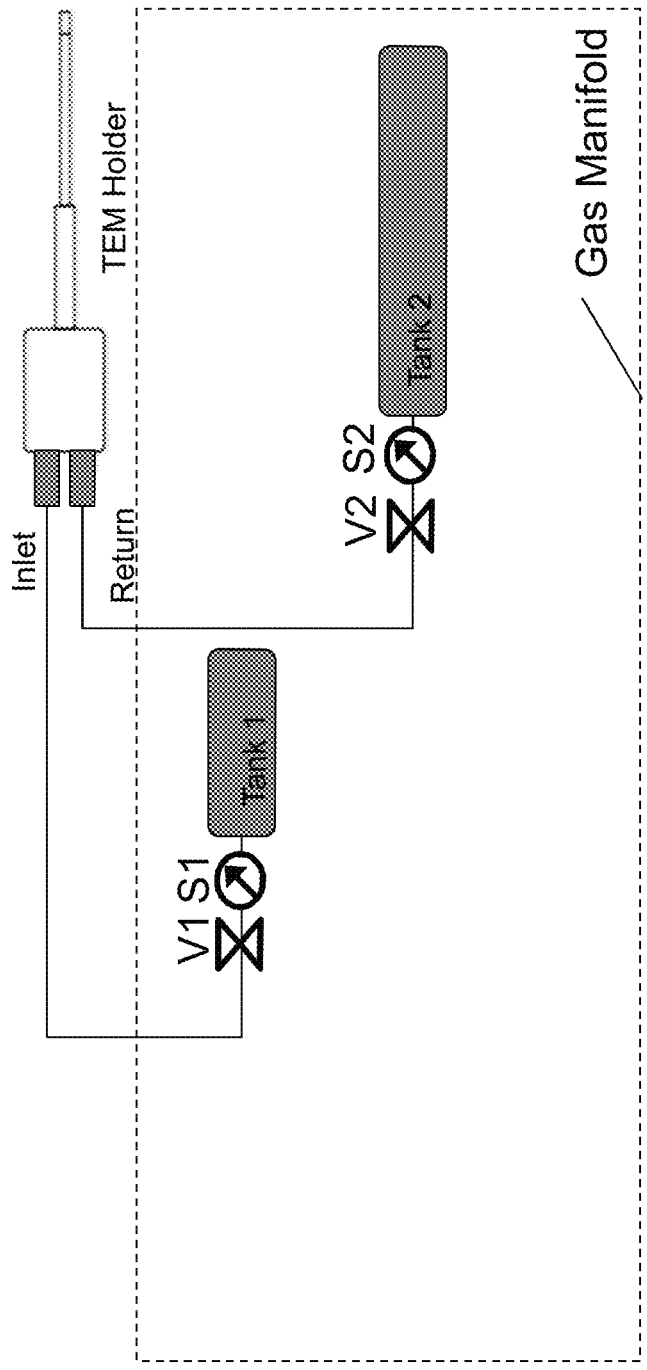
Figure 3b - Gas Flow System with two valves and two pressure sensors:

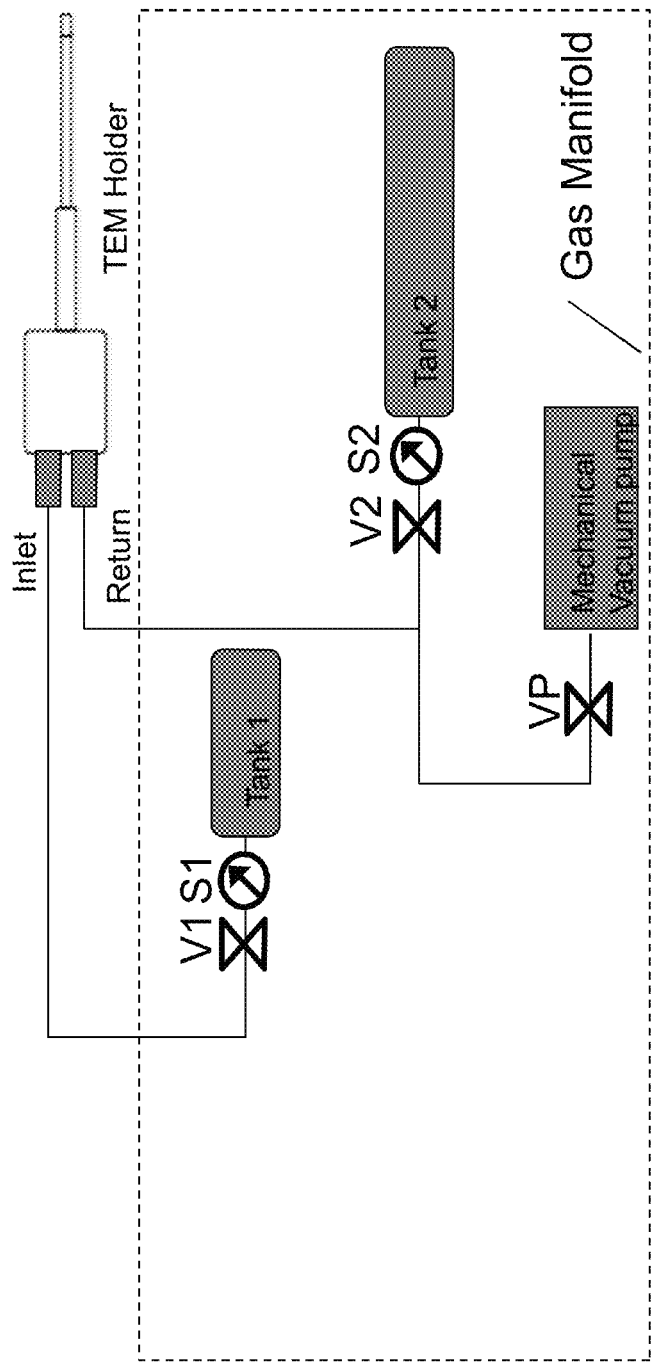
Figure 3c - Gas Flow System with 3 valves and two pressure sensors and a mechanical vacuum pump.
Symbols
Solenoid Valve: ✖
Pressure Gage: ⊙

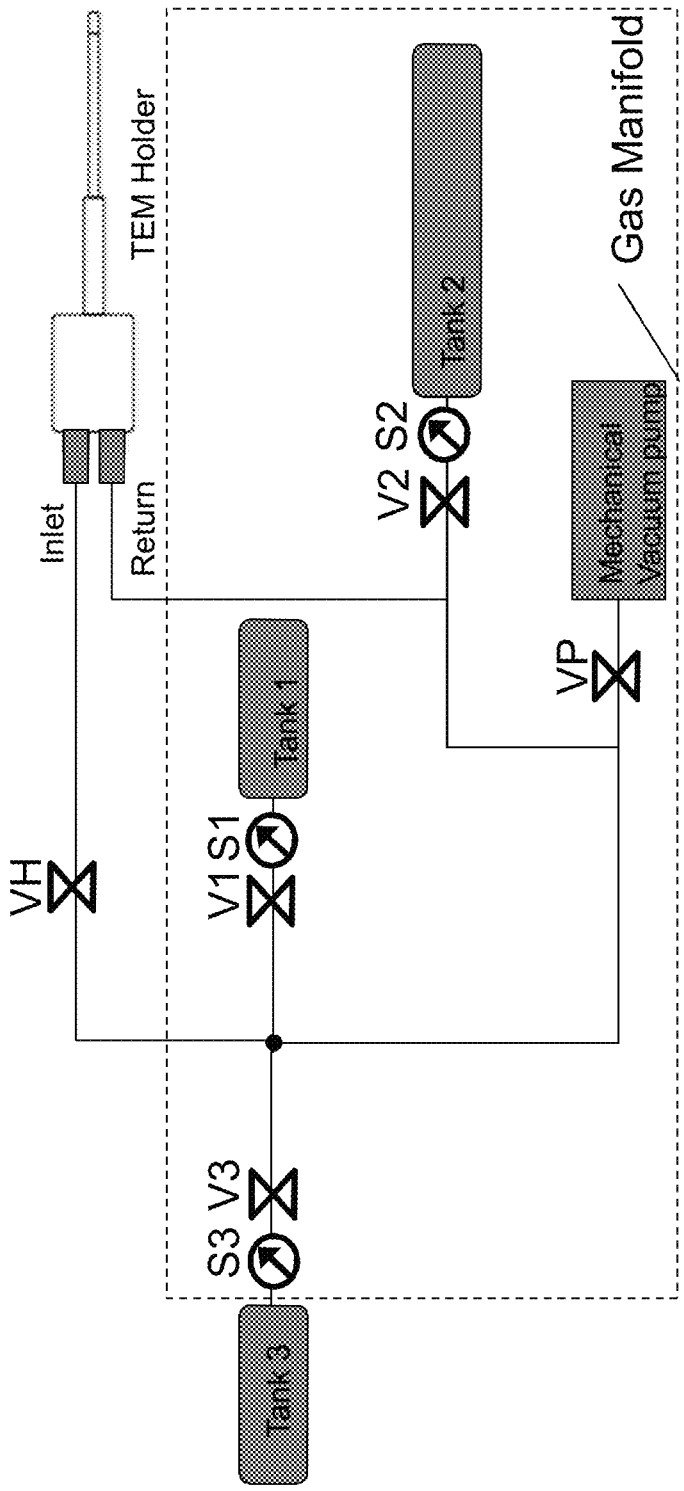
Figure 3d - Gas Flow System with an external gas source (Tank 3)
Symbols
Solenoid Valve: ✕
Pressure Gage: ⊙

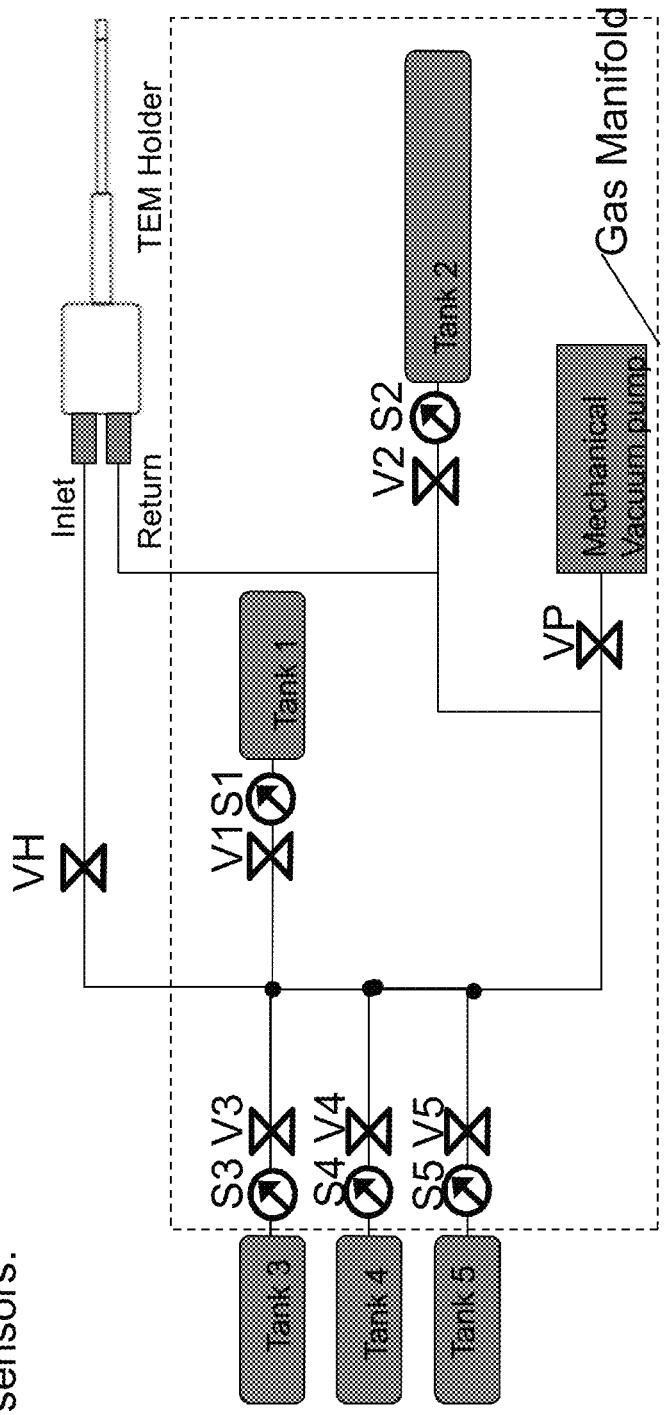
Figure 3e - Gas Flow System with additional tanks, valves and pressure sensors.
Symbols
Solenoid Valve:
Pressure Gage:

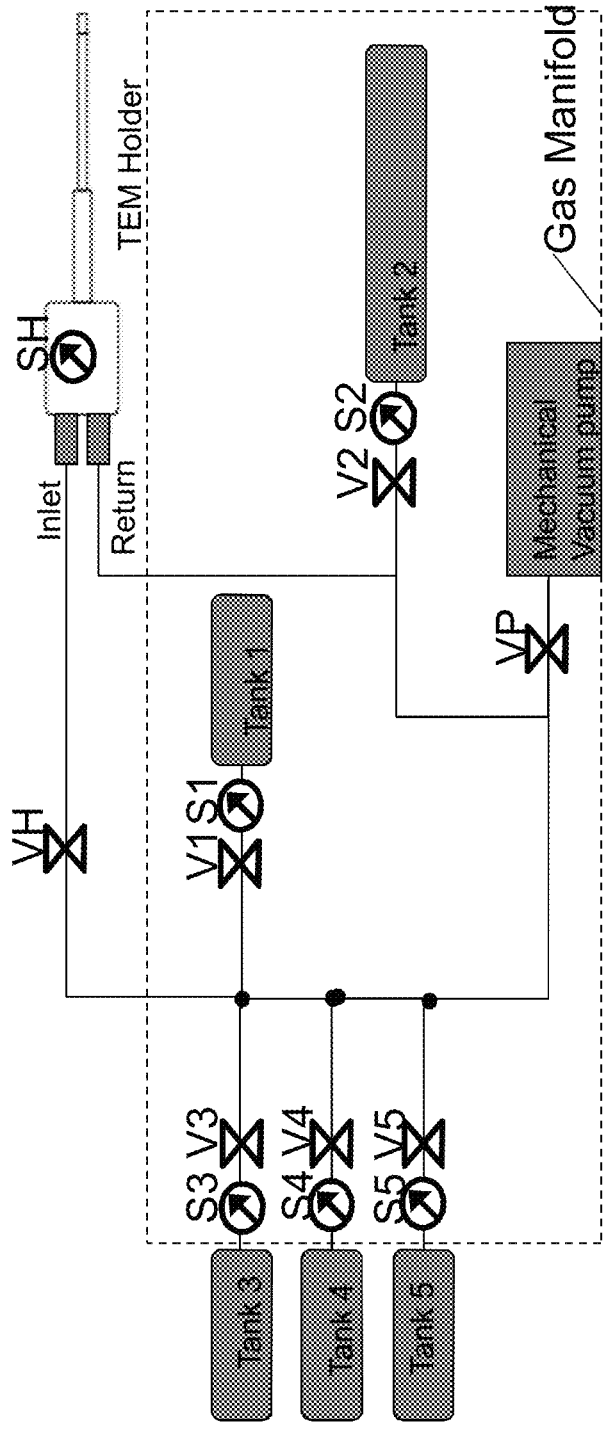
Figure 3f - Gas Flow System with additional tanks, valves and pressure sensors including pressure sensor in the TEM holder.

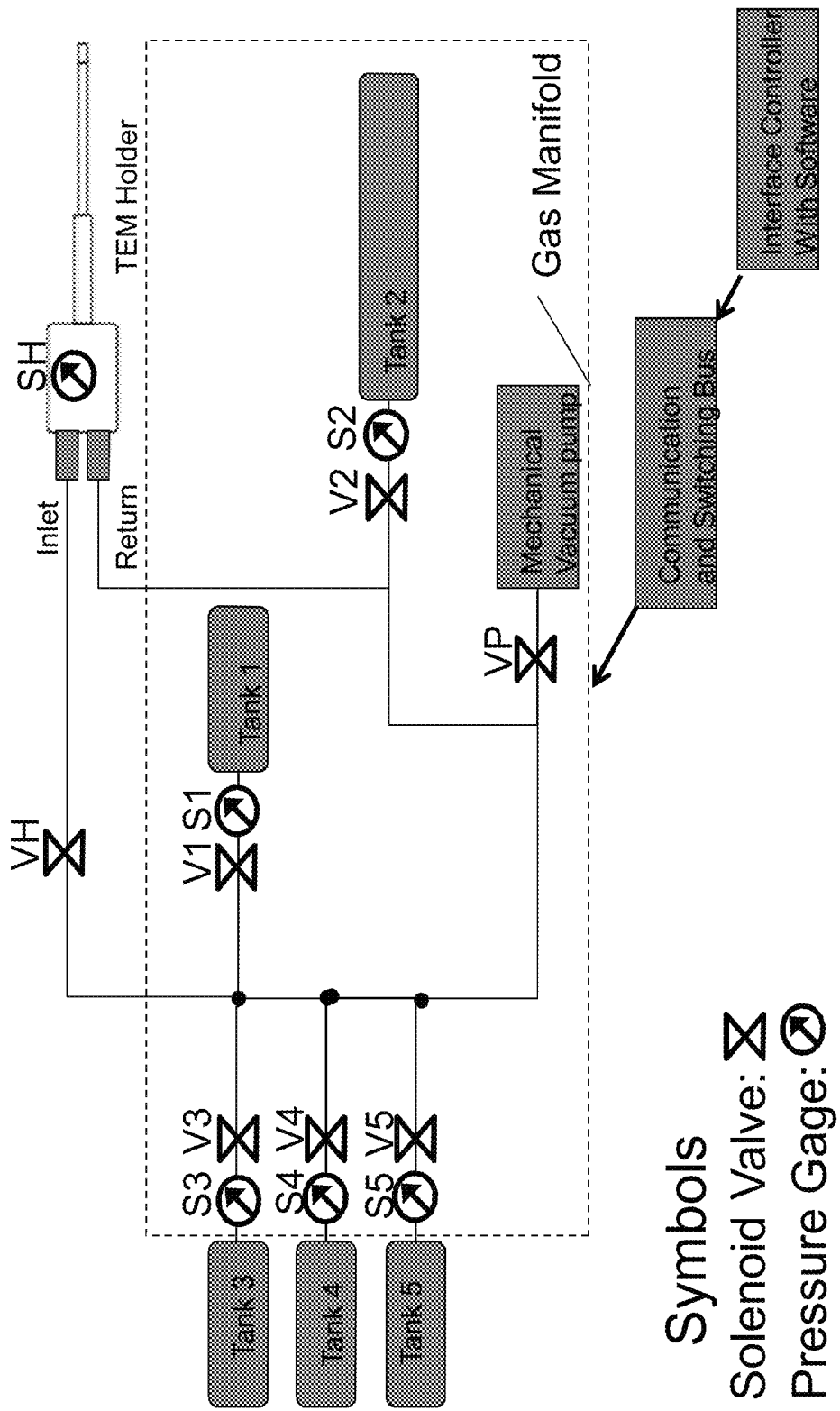
Figure 3g - Gas Flow System with controller and SW.

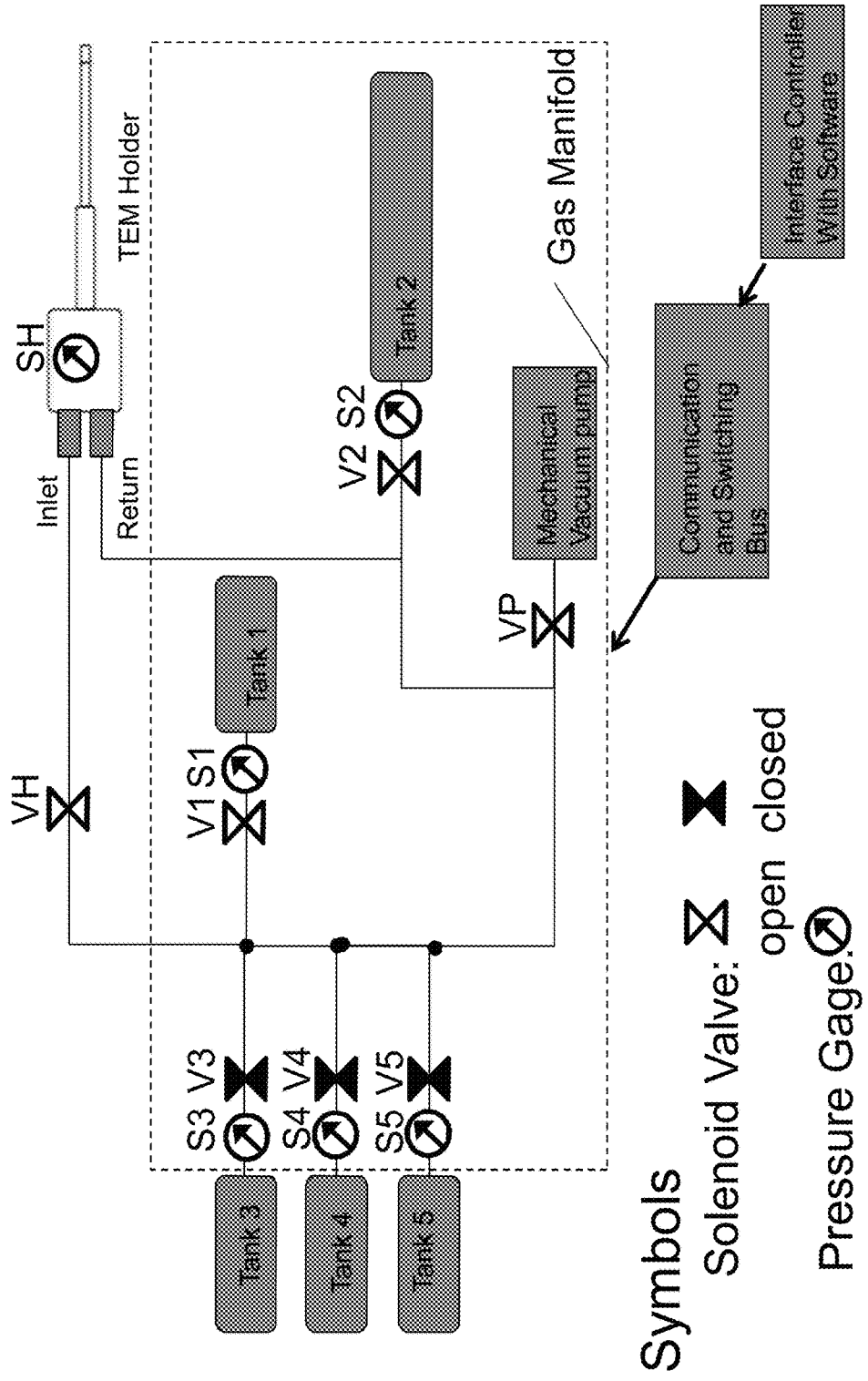
FIGURE 5a - USE CASE 1 - PURGE SYSTEM

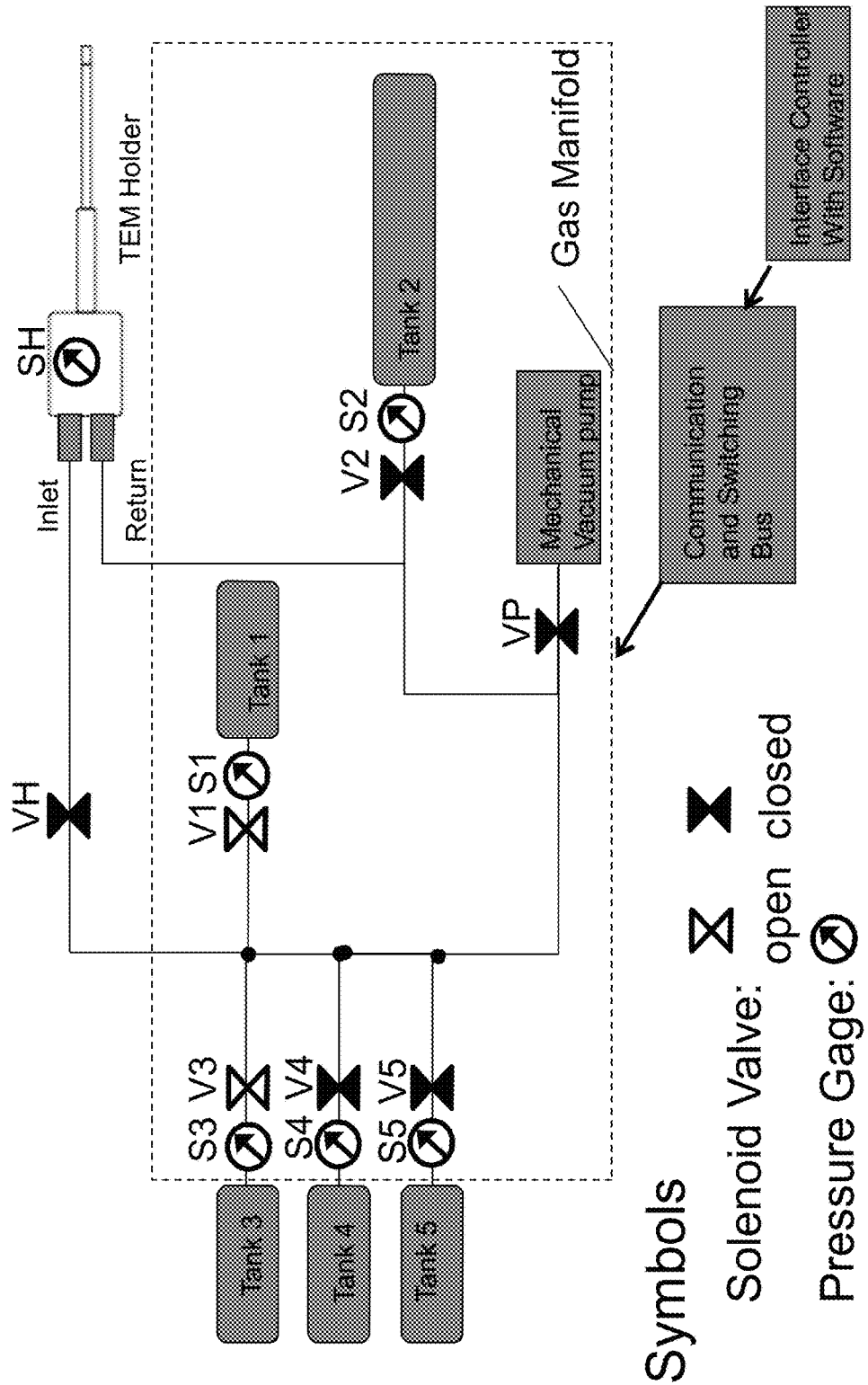
FIGURE 5b - USE CASE 2 – BACKFILL TANK 1

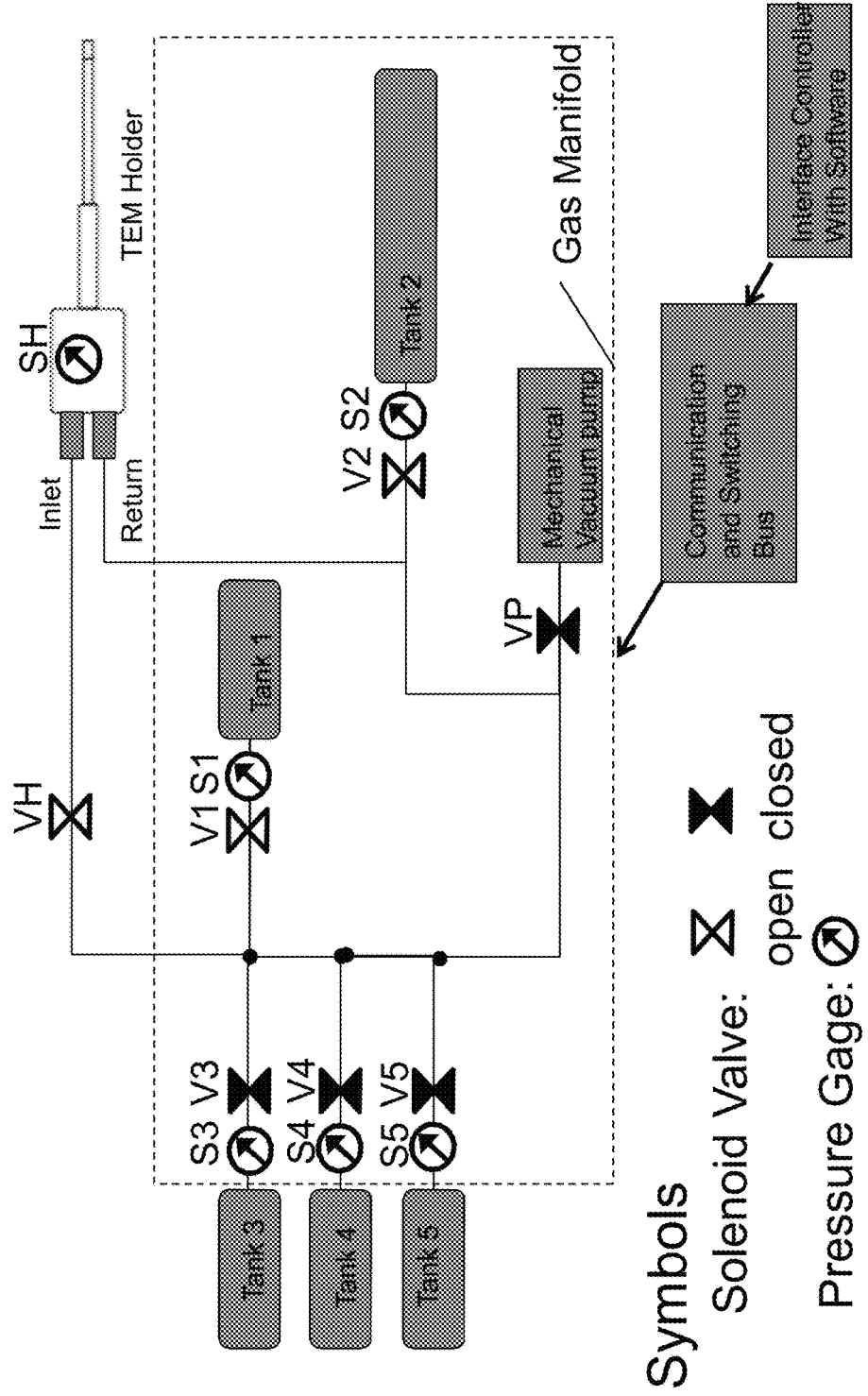
FIGURE 5c - USE CASE 3 - GAS FLOW EXPERIMENT

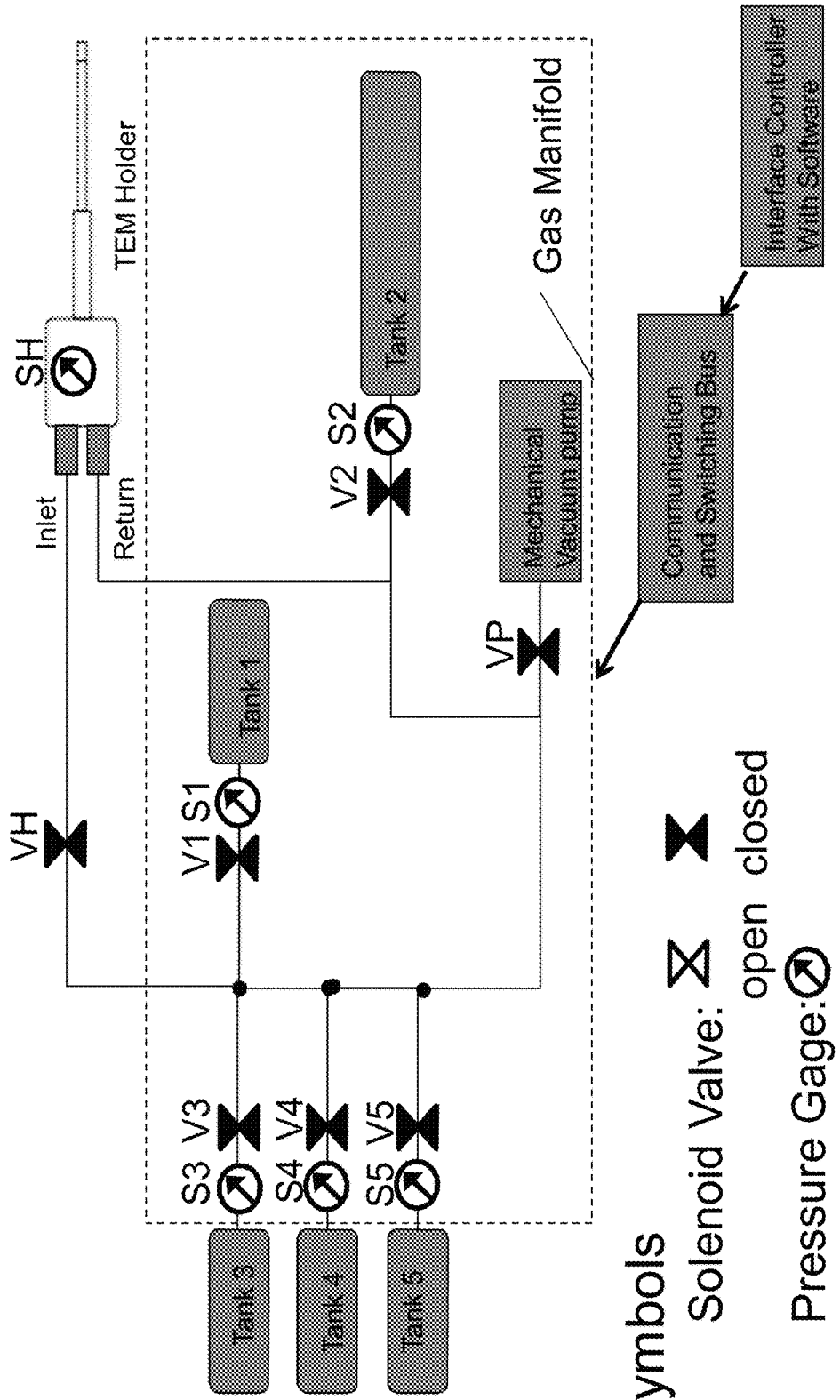
FIGURE 5d - USE CASE 4 – STATIC GAS EXPERIMENT

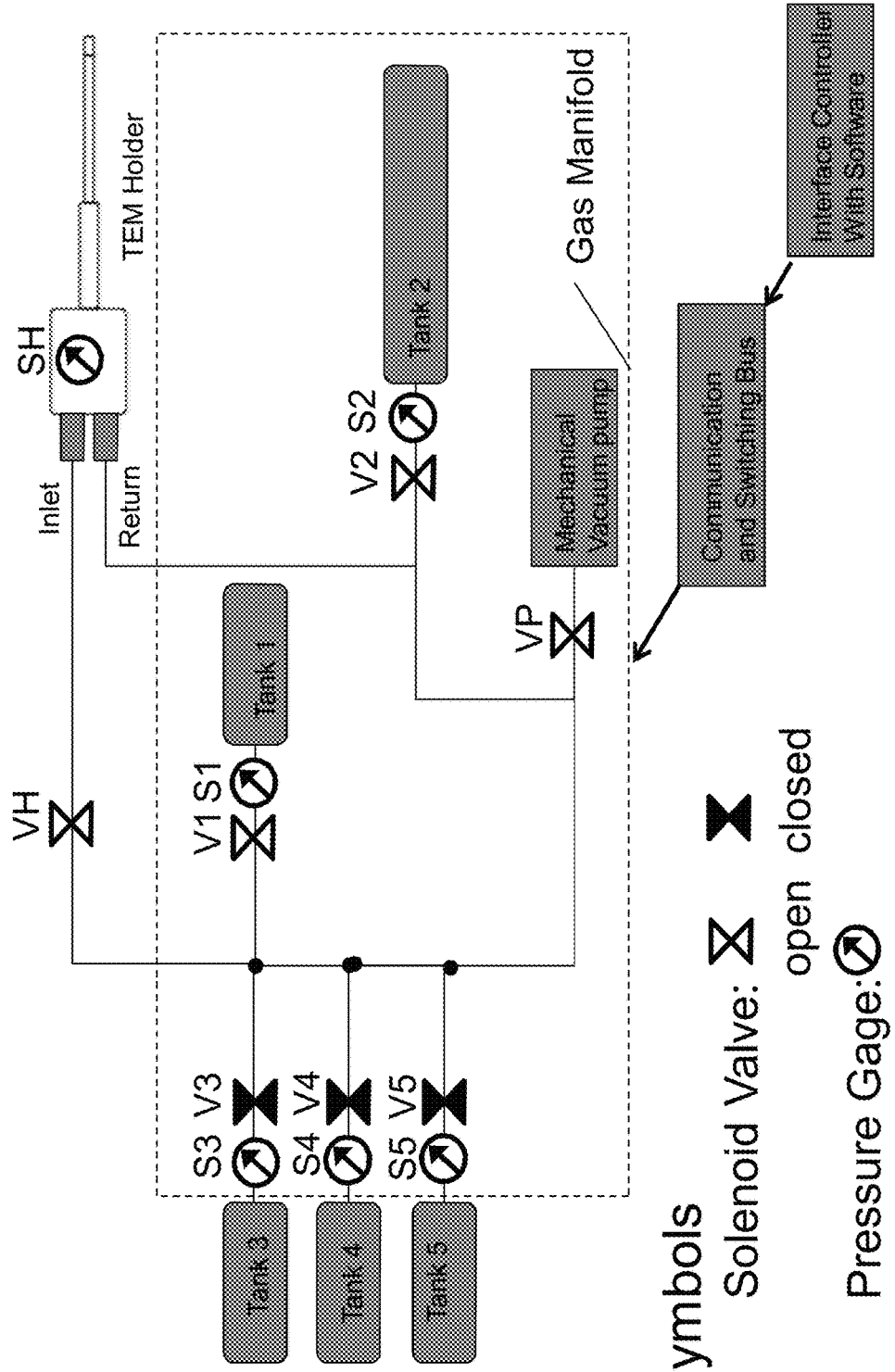
FIGURE 5e - USE CASE 5 – PURGE SYSTEM

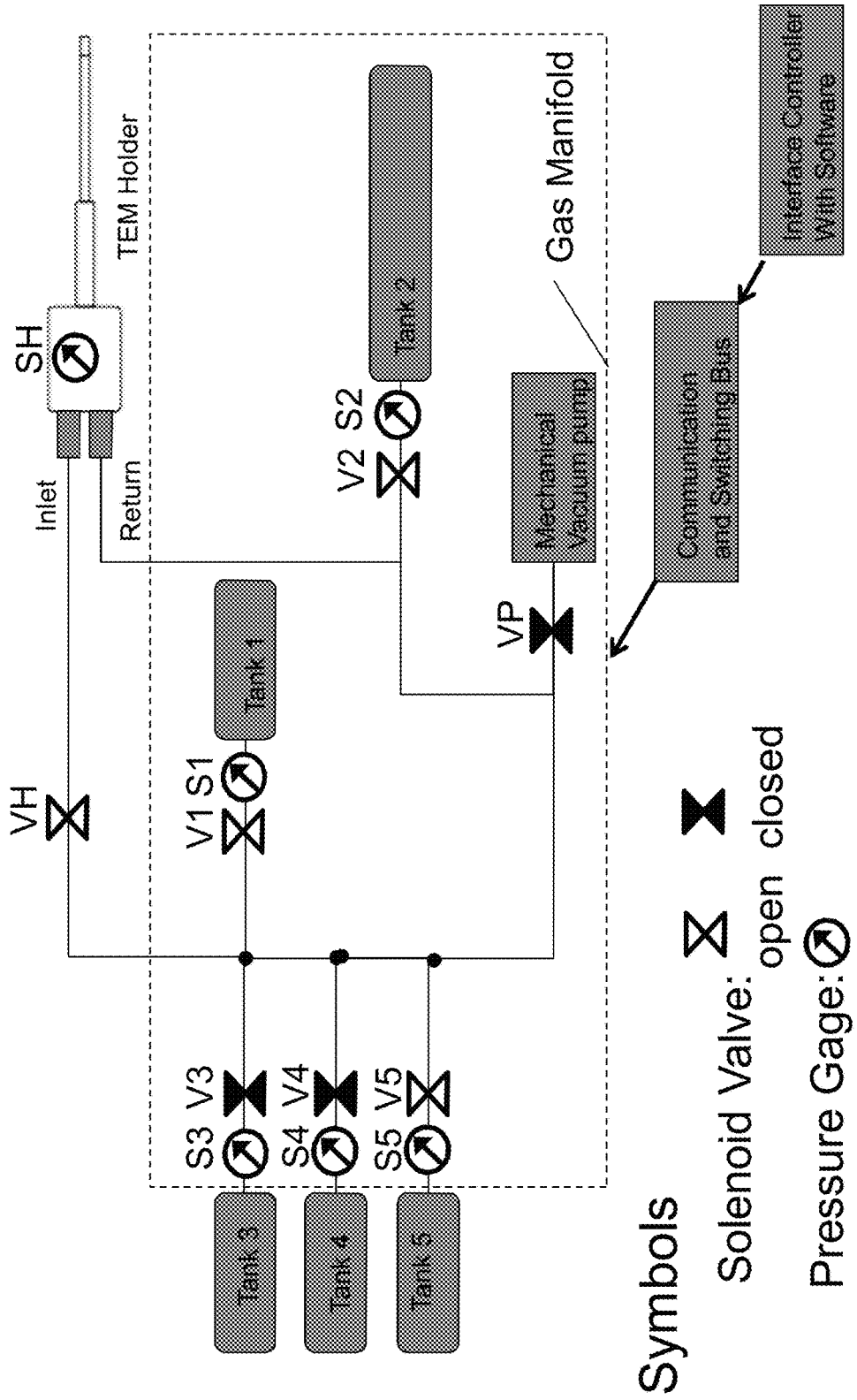

METHOD FOR SAFE CONTROL OF GAS DELIVERY TO AN ELECTRON MICROSCOPE SAMPLE HOLDER

CROSS REFERENCE TO RELATED APPLICATIONS

This application is a continuation of U.S. patent application Ser. No. 14/816,332 filed on Aug. 3, 2015 and entitled "Method for Safe Control of Gas Delivery to an Electron Microscope Sample Holder," and claims priority to U.S. Provisional Patent Application No. 62/032,612 filed on Aug. 3, 2014 and entitled "Method for Safe Control of Gas Delivery to an Electronic Microscope Sample Holder, " which is hereby incorporated herein in its entirety.

FIELD

The invention relates generally to a system and method for safely controlling the containment of gas within a manifold system and the delivery of gas to a sample holder for an electron microscope, e.g., a transmission electron microscope (TEM), a scanning transmission electron microscopy (STEM) and variations of the scanning electron microscopes (SEM) that use traditional TEM-type holders and stages, for imaging and analysis.

BACKGROUND

The options for studying solid and gas interactions in an electron microscope are limited to a couple of types of systems. Commercially available environmental scanning/transmission electron microscope (ESEM/ETEM) technologies create a gaseous environment close to the object under investigation and enable the atomic scale study of phenomena occurring during gas-solid interactions. This gas environment is typically limited to low pressures of less than 15 Torr. Alternatively, for pressures up to 760 Torr or higher, special gas sample holders, called "environmental sample holders," create a sealed gas environment and utilize membranes transparent to the electron beam to enable the atomic scale study.

The sample holder is a component of an electron microscope providing the physical support for samples under observation. Sample holders traditionally used for TEMs and STEMs, as well as some modern SEMs, consist of a rod that is comprised of three key regions: the end, the band and the specimen tip. In addition to supporting the sample, the sample holder provides an interface between the inside of the instrument (i.e., a vacuum environment) and the outside world.

To use the sample holder, one or more samples are first placed on a sample support device. The sample support device is then mechanically fixed in place at the specimen tip, and the sample holder is inserted into the electron microscope through a load-lock. During insertion, the sample holder is pushed into the electron microscope, assisted by the vacuum within the microscope, until it stops, which results in the specimen tip of the sample holder being located in the column of the microscope. At this point, the barrel of the sample holder bridges the space between the inside of the microscope and the outside of the load lock, and the end of the sample holder is outside the microscope. To maintain an ultra-high vacuum environment inside the electron microscope, flexible o-rings are typically found along the barrel of the sample holder, and these o-rings seal against the microscope when the sample holder is inserted. The exact shape and size of the sample holder varies with the type and manufacturer of the electron microscope, but each holder contains the three aforementioned key regions.

The sample holder can also be used to provide stimulus to the sample, and this stimulus can include temperature (e.g., heating or cooling), electricity (e.g., applying a voltage or current), mechanical (e.g., applying stress or strain), gas or liquid (e.g., containing a sample in a specific gaseous or liquid environment), or several at once. For example, a gas delivery system can be used to move gas to a sample during imaging. This equipment is outside of the microscope, and various connectors are used to bring this stimulus to the sample holder, down the length of the holder, and to the samples. For example, microfluidic tubing can be used to supply gas from a gas delivery system to the sample.

One configuration is an environmental cell wherein two semiconductor devices comprising thin windows are used, and samples are sandwiched between the two semiconductor devices, and the environment in proximity of the sample, including an electrical field and a gas or liquid flow, can be precisely controlled. The present applicant previously described novel apparatuses and methods to contact and align devices used to form liquid or gas cells in International Patent Application No. PCT/US2011/46282 filed on Aug. 2, 2011 entitled "ELECTRON MICROSCOPE SAMPLE HOLDER FOR FORMING A GAS OR LIQUID CELL WITH TWO SEMICONDUCTOR DEVICES," which is hereby incorporated herein by reference in its entirety.

Disadvantageously, to date, environmental sample holders have had only limited availability, in part because these holders have lacked a gas delivery system with the necessary safety controls.

Environmental sample holders typically require the user to flow a gas or gases of interest into and out of the holder. The electron microscope requires a high vacuum to function, and therefore a leak from the gas sample holder into the microscope would be problematic. For example, the leak would contaminate components inside the microscope. A worse case event would be irreparable damage to the FEG (Field Emission Gun). Therefore, it is important to have a system that can detect and/or prevent and/or stop gas leaks inside the electron microscope that could cause damage.

Furthermore, the gas being delivered to the holder could be harmful if exposed to the environment outside of the microscope. For example, a toxic gas leaked into the environment could harm a person or a volatile gas could result in a fire or explosion. Therefore, it is important to have a system that can detect and/or prevent and/or stop gas that could be dangerous (toxic or volatile) from entering the human environment.

Additionally, combining two or more dissimilar gases together may not be safe as it could result in a reaction and/or a harmful mixture. A system that can prevent mixing of gases from occurring, until desired, will make a gas delivery system inherently safer.

Accordingly, a gas delivery system that can detect and react safely to leaks and other gas safety issues is needed and is described herein.

SUMMARY

The invention relates generally to a system and method for safely controlling the containment of gas within a manifold system and the delivery of gas to a sample holder for an electron microscope for imaging and analysis.

In one aspect, a gas delivery system is described, said system comprising an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected.

In another aspect, a gas delivery system is described, said system comprising an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected, further comprising at least one set of components communicatively connected and selected from the group consisting of (a) a pressure sensor S1 and a valve V1 between tank T1 and the at least one inlet port, optionally wherein the pressure sensor S1 is attached to the tank T1;
(b) pressure sensor S2 and a valve V2 between tank T2 and the at least one outlet port, optionally wherein the pressure sensor S2 is attached to the tank T2;
(c) a pressure sensor SH for sensing the pressure within the sample holder and a valve VH between valve V1 and the at least one inlet port;
(d) a mechanical vacuum pump with a valve VP positioned between the mechanical vacuum pump and the rest of the system; and
(e) any combination of (a)-(e).

In yet another aspect, a gas delivery system is described, said system comprising an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected, further comprising at least one set of components communicatively connected and selected from the group consisting of
(a) a pressure sensor S1 and a valve V1 between tank T1 and the at least one inlet port, optionally wherein the pressure sensor S1 is attached to the tank T1;
(b) a pressure sensor S2 and a valve V2 between tank T2 and the at least one outlet port, optionally wherein the pressure sensor S2 is attached to the tank T2;
(c) a pressure sensor SH for sensing the pressure within the sample holder and a valve VH between valve V1 and the at least one inlet port;
(d) a mechanical vacuum pump with a valve VP positioned between the mechanical vacuum pump and the rest of the system; and
(e) tank T3 which is communicatively connected to the tubing connecting valve V1 and valve VH, such that tank T3 can be in fluid communication with tank T1 and gas can travel between tank T3 and tank T1, and wherein a valve V3 is positioned between tank T3 and the tubing connecting valve V1 and valve VH.

In still another aspect, a method of purging a gas delivery system of an environmental electron microscope holder is described, said method comprising opening valves V1, V2, VH and VP of a system, and evacuating gas from the system to a pressure P1, as detected by pressure sensors S1 and/or S2, wherein the system comprises an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected, further comprising at least one set of components communicatively connected and selected from the group consisting of
(a) a pressure sensor S1 and a valve V1 between tank T1 and the at least one inlet port, optionally wherein the pressure sensor S1 is attached to the tank T1;
(b) a pressure sensor S2 and a valve V2 between tank T2 and the at least one outlet port, optionally wherein the pressure sensor S2 is attached to the tank T2;
(c) a pressure sensor SH for sensing the pressure within the sample holder and a valve VH between valve V1 and the at least one inlet port;
(d) a mechanical vacuum pump with a valve VP positioned between the mechanical vacuum pump and the rest of the system.

Another aspect relates to a method of filling a tank T1 of a gas delivery system of an environmental electron microscope holder with an experiment gas, said method comprising closing valves V2, VH and VP of a system; opening valves V1 and V3 and allowing gas to flow from tank T3 to tank T1 until a pressure P1 is achieved as determined by pressure sensor S1, wherein the system comprises an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected, further comprising at least one set of components communicatively connected and selected from the group consisting of
(a) a pressure sensor S1 and a valve V1 between tank T1 and the at least one inlet port, optionally wherein the pressure sensor S1 is attached to the tank T1;
(b) a pressure sensor S2 and a valve V2 between tank T2 and the at least one outlet port, optionally wherein the pressure sensor S2 is attached to the tank T2;

(c) a pressure sensor SH for sensing the pressure within the sample holder and a valve VH between valve V1 and the at least one inlet port;
(d) a mechanical vacuum pump with a valve VP positioned between the mechanical vacuum pump and the rest of the system.

Yet another aspect relates to a method of flowing gas through an environmental electron microscope sample holder, said method comprising opening valves V1, VH and V2 of a system and permitting the gas to flow from tank Ti through the sample holder to tank T2, wherein the system comprises an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected, further comprising at least one set of components communicatively connected and selected from the group consisting of
(a) a pressure sensor S1 and a valve V1 between tank T1 and the at least one inlet port, optionally wherein the pressure sensor S1 is attached to the tank T1;
(b) a pressure sensor S2 and a valve V2 between tank T2 and the at least one outlet port, optionally wherein the pressure sensor S2 is attached to the tank T2;
(c) a pressure sensor SH for sensing the pressure within the sample holder and a valve VH between valve V1 and the at least one inlet port;
(d) a mechanical vacuum pump with a valve VP positioned between the mechanical vacuum pump and the rest of the system.

Still another aspect relates to a method of preventing gas leakage into an electron microscope from an environmental electron microscope sample holder, wherein pressure electron microscope ($p_{EM}$)<pressure of tank T1 ($p_{T1}$)<atmospheric pressure ($p_{atm}$), said method comprising monitoring pressure sensors S1, S2 and SH of a system, wherein a decrease in pressure of at least one of pressure sensors S1, S2 and SH indicates a leak into the electron microscope, and closing any open valves, wherein the system comprises an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected, further comprising at least one set of components communicatively connected and selected from the group consisting of
(a) a pressure sensor S1 and a valve V1 between tank T1 and the at least one inlet port, optionally wherein the pressure sensor S1 is attached to the tank T1;
(b) a pressure sensor S2 and a valve V2 between tank T2 and the at least one outlet port, optionally wherein the pressure sensor S2 is attached to the tank T2;
(c) a pressure sensor SH for sensing the pressure within the sample holder and a valve VH between valve V1 and the at least one inlet port;
(d) a mechanical vacuum pump with a valve VP positioned between the mechanical vacuum pump and the rest of the system.

In another aspect, a method of preventing gas leakage into an environment outside of a gas delivery system of an environmental electron microscope sample holder is described, wherein pressure electron microscope ($p_{EM}$) <pressure of tank T1 ($p_{T1}$)>atmospheric pressure ($p_{atm}$), said method comprising monitoring pressure sensors S1, S2 and SH of a system, wherein a decrease in pressure of at least one of pressure sensors S1, S2 and SH indicates a leak into the environment, and closing any open valves, wherein the system comprises an environmental electron microscope sample holder with at least one inlet port and at least one outlet port wherein the at least one inlet port is communicatively connected to a tank T1 and the at least one outlet port is communicatively connected to a tank T2 such that at least one gas can travel from tank T1 through the sample holder to tank T2, said gas delivery system further comprising at least one pressure sensor and at least one valve, wherein the at least one pressure sensor is monitored using controls software with logic that is programmed to identify a leak in the system and the controls software will signal the closure of the at least one valve if a leak is detected, further comprising at least one set of components communicatively connected and selected from the group consisting of
(a) a pressure sensor S1 and a valve V1 between tank T1 and the at least one inlet port, optionally wherein the pressure sensor S1 is attached to the tank T1;
(b) a pressure sensor S2 and a valve V2 between tank T2 and the at least one outlet port, optionally wherein the pressure sensor S2 is attached to the tank T2;
(c) a pressure sensor SH for sensing the pressure within the sample holder and a valve VH between valve V1 and the at least one inlet port;
(d) a mechanical vacuum pump with a valve VP positioned between the mechanical vacuum pump and the rest of the system.

Other aspects, features and embodiments of the invention will be more fully apparent from the ensuing disclosure and appended claims.

BRIEF DESCRIPTION OF THE DRAWINGS

FIG. 2a is a plan view of an embodiment of the closed sample holder cell with the sample holder cover on. FIG. 2b is a plan view of the sample holder cell of FIG. 2a with the sample holder cover off. FIG. 2c is a plan view of the sample holder cell of FIG. 2b with the large MEMS chip removed. FIG. 2d is a plan view of the sample holder cell of FIG. 2c with the small MEMS chip removed.

FIG. 3a depicts the components for an embodiment of the system that can deliver gas to an environmental cell sample holder, wherein said system includes two tanks.

FIG. 3b depicts a system of FIG. 3a including two valves (V1, V2) and two pressure sensors (S1, S2).

FIG. 3c depicts a system of FIG. 3b including a mechanical vacuum pump and valve VP.

FIG. 3d depicts a system of FIG. 3c including Tank 3, pressure sensor S3 and Valve V3, and Valve VH upstream from the holder.

FIG. 3e depicts a system of FIG. 3d including external Tank 4 and Tank 5, valves V4, V5 and pressure sensors S4.

FIG. 3f depicts a system of FIG. 3e including a pressure sensor SH inside the TEM holder.

FIG. 3g depicts a system of FIG. 3f including an interface controller with software as well as a communication and switching bus.

FIG. 5a illustrates an example of the purge of the system of FIG. 3g.

FIG. 5b illustrates an example of the filling, or backfill, of Tank 1 of FIG. 5a with the experiment gas.

FIG. 5c illustrates an example of a gas flow experiment using the system of FIG. 5b.

FIG. 5d illustrates the end use of the system of FIG. 5c.

FIG. 5e illustrates the purge of the system of FIG. 5d.

FIG. 5f illustrates the return of the system of FIG. 5e to its initial stage by backfilling with nitrogen.

DETAILED DESCRIPTION

Figure 1:
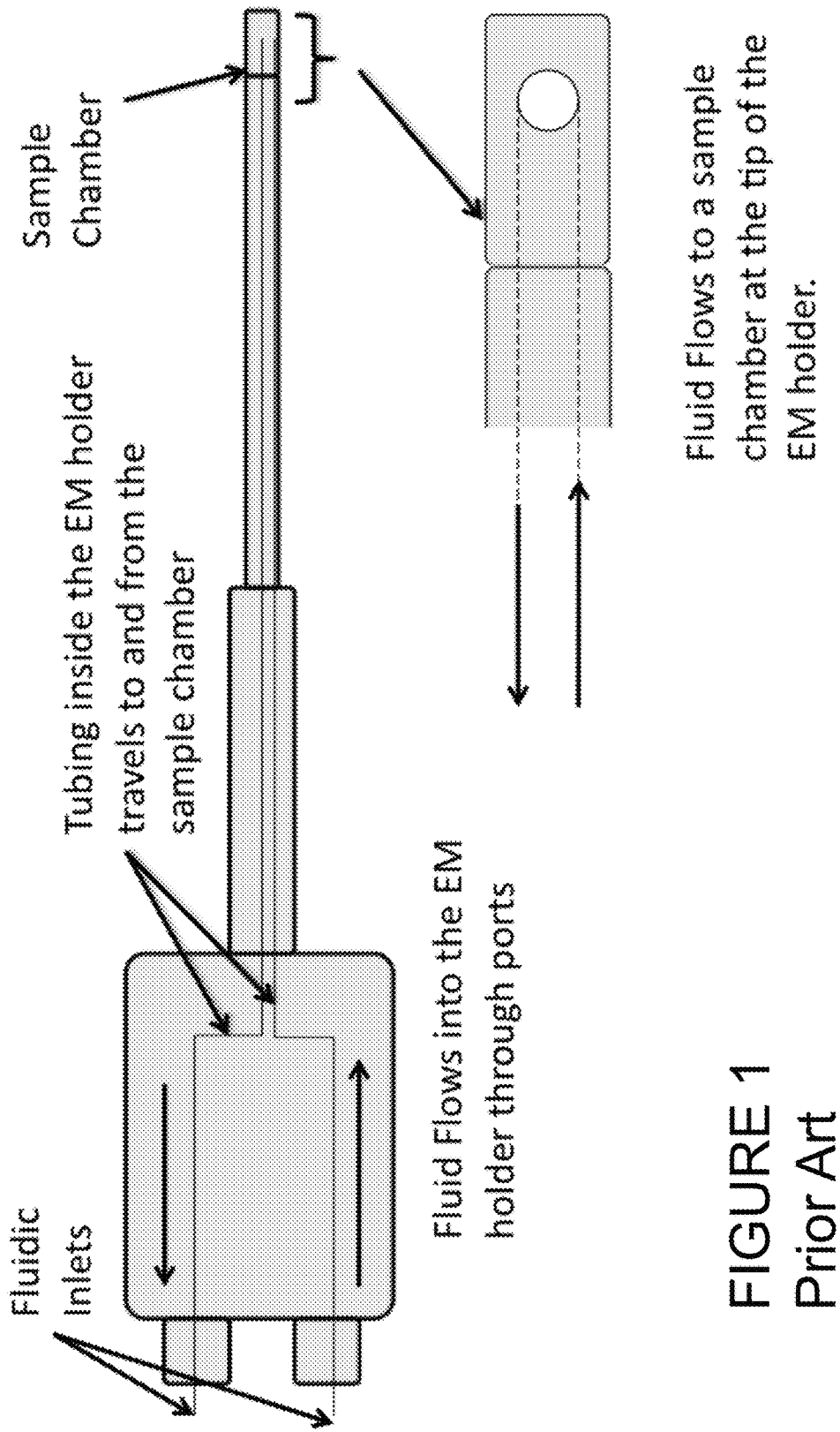
FIG. 1 illustrates a typical electron microscope sample holder having two ports for gas or liquid to flow into and out of a cavity at the tip of the holder.

The sample holder of the present disclosure is broadly illustrated in FIG. 1, wherein the sample holder includes tubing inside the electron microscope (EM) holder that travels to and from the closed cell at the specimen tip. The placement of the tubing is just for general illustration and is not intended to limit the holder in any way. The tubing permits fluids, e.g., gases or liquids, to travel to and from the closed cell, for in situ analysis of the sample positioned in the closed cell. The general area of "in situ" electron microscopy involves applying stimulus to a sample during imaging. The stimulus could be thermal (heating or cooling), electrical (applying a voltage or current), mechanical (applying stress or strain), chemical (containing a sample in a specific chemical environment), or several of these at once.

FIGS. 2a-2d illustrate an example of the closed cell that is positioned at the specimen tip of FIG. 1. The closed cell in FIGS. 2a-2d is just for general illustration and is not intended to limit the closed cell in any way. FIG. 2a is a plan view of the closed cell, wherein a cover of the closed cell is shown positioned and affixed, e.g., with screws, to the cell. FIG. 2b is a plan view of the closed cell with the cover off, revealing the first of two MEMS chips (i.e., a sample support device) positioned in the cell. FIG. 2c is a plan view of the closed cell showing the second of two MEMS chips after the first MEMS chip is removed. The large and small MEMS chips are stacked on top of one another and the sample can be "sandwiched" between the two chips (not shown). FIG. 2c also reveals the first of two O-rings, which is positioned below the large MEMS chip to seal the cell so liquid or gas can be introduced into the cell. FIG. 2d is a plan view of the closed cell showing the bottom of the cell after the second MEMS chip is removed. FIG. 2d also reveals the second of two O-rings, which is positioned below the small MEMS chip to form the second seal so liquid or gas can be introduced into the cell. The fluidic reservoir in FIG. 2d corresponds to the area between the two O-rings when the MEMS chips are in place. Although not illustrated in FIGS. 2a-2d per se, the fluidic reservoir indicated in FIG. 2d has depth to accommodate the MEMS chips. It should be appreciated that the "closed cell" remains in fluid communication with fluidic inlets and hence the closed cell receives gasses from an external source and gasses are returned from the closed cell to an external source. It is to be understood that the closed cell described herein is compatible with and may be interfaced with the sample support devices, e.g., semiconductor sample support devices, disclosed in International Patent Application Nos. PCT/US08/63200 filed on May 9, 2008, PCT/US11/46282 filed on Aug. 2, 2011, and PCT/US08/88052 filed on Dec. 22, 2008, which are all incorporated herein by reference in their entireties. It should also be appreciated by one skilled in the art that alternative sample support devices may be interfaced with the closed cell described herein. The closed cell provides mechanical support for one or more samples or sample support devices and also provides other stimuli (e.g., temperature, electricity, mechanical, chemical, gas or liquid, or any combination thereof) to the samples or sample support devices. The closed cell can be manufactured with tips, barrels and ends of various shapes and sizes such that the sample holder fits any manufacturer's electron microscope.

As used herein, a "sample support device" corresponds to a structure that holds a sample for microscopic imaging. A sample support device can provide an experimental region. Devices may include one, more than one or even an array of experimental regions and may include integrated features such as electrodes, thermocouples, and/or calibration sites, as readily determined by one skilled in the art. One preferred embodiment includes sample support devices made with MEMS technology and with thin membranes (continuous or perforated) for supporting a sample in the experimental region. Sample support devices include, but are not limited to, a window device, an electrical device and a heating device.

As defined herein, the term "tank" is intended to mean a source of gas at a pressure. Typically a tank would be a hermetic enclosure. Alternatively, in some cases, it could be atmospheric air or a mass flow controller.

FIG. 3a depicts an embodiment of a system that can deliver gas to an environmental cell sample holder. The TEM holder is connected to a tank T1 with gas at pressure P1 and a tank T2 initially without gas at pressure P2, where both tanks are connected with tubing to an inlet and an outlet of the holder, respectively. Pressure P1 is at a higher pressure than P2 and therefore the gas will flow from tank T1 through the holder and into tank T2. Without further components, the pressure(s) in the system cannot be monitored and the gas flow cannot be quickly and easily stopped.

FIG. 3b depicts a system that adds two valves (V1, V2) and two pressure sensors (S1, S2) to the system of FIG. 3a. The valves would allow the gas stream to be open or closed. Depending on the type of valve, the valve could be opened mechanically (i.e., by hand) or electronically by a controller. Some types of valves, like a needle valve, can add a variable restriction to regulate the rate of gas flow. A type of valve preferred in this system is a normally closed electrically-activated solenoid valve, such as p/n 6LVV-DPFR4-P1-CM offered by Swagelok. Because they can be used in controls automation, electronic pressure sensors are the preferred type of pressure sensor for this system. Pressure sensors such as the "Baritron" brand offered by MKS Instruments are able to provide real time pressure values. These values are used to establish the desired state of gas and pressure within a region of the system. These components in FIG. 3b enable the pressure in the tanks to be monitored and also allow for the closure of the gas line between the tanks and the holder. Because the preferred pressure sensors and valves in this embodiment are intended for use with controls automation, additional equipment including a controller and software may be necessary, as described later. Although FIG. 3b displays sensors S1 and S2 between the tanks and the valve, the sensors could be attached to the tank itself with equal results, which is true for all display sensors described in the present disclosure.

FIG. 3c adds a mechanical vacuum pump and valve VP to the system. The primary purpose of the pump is to remove gas from the system or parts of the system. For example, Tank 2 will eventually fill with the gas being delivered from Tank 1 and a vacuum pump is an easy way to remove these gases. Typical use cases including the use of the pump and valve VP will be described in more detail later. Depending on the toxicity or volatility of the gases being used, the mechanical vacuum pump will send the exhausted gas to a safe location away from harm, such as into a fume hood or directly outside the building.

FIG. 3d adds Tank 3, pressure sensor S3 and Valve V3, and Valve VH to the system of FIG. 3c, upstream from the holder. Tank 3 is intended to be external to the rest of the manifold for the purpose of being disconnected so that it can be refilled or replaced when empty, or replaced with a tank containing a different gas. Tank 3 will be at a pressure greater than Tank 1, such that gas from Tank 3 can be flowed into Tank 1 until the desired pressure P1 is achieved. P1 is dependent on what pressure the user wants to achieve in the TEM holder. By having tank 3 at a higher pressure (i.e., more gas), tank 1 can be replenished whenever needed until the gas in tank 3 is exhausted. This can be done by opening the valves V1, V3 between tank 1 and tank 3, closing valves V2, VP, and VH, and when the pressure sensor S1 read the desired pressure for Tank 1, the valves are closed.

FIG. 3e adds external Tank 4 and Tank 5, valves V4, V5 and pressure sensors S4 and S5 to the system of FIG. 3d. The addition of Tank 4 and 5 and their associated valves V4, V5 and sensors S4 and S5 is to allow at least 3 different gases to be connected to the manifold at one time. This makes the system much easier to use because the user will not need to physically replace Tank 3 if a different gas is desired to be used in the system. It is also highly desired that one of the three external tanks 3, 4, or 5 contains what is referred to as a purge gas. A purge gas is a gas used to displace unwanted gas from the system, typically done before and/or after an experiment has been completed.

FIG. 3f adds a pressure sensor SH inside the TEM holder of the system of FIG. 3e. The present applicant previously described novel apparatuses and methods to sense pressure and other states inside liquid or gas cells in US Provisional Patent Application No. 61/941,743 filed on Feb. 19, 2014, and International Patent Application No. PCT/US2015/016562 filed on Feb. 19, 2015, both entitled "METHOD FOR MONITORING ENVIRONMENTAL STATES OF A MICROSCOPE SAMPLE WITH AN ELECTRON MICROSCOPE SAMPLE HOLDER," which are hereby incorporated herein by reference in their entirety. Measuring the pressure in the region of the sample provides the user more accurate information about the gas environment of the sample. By monitoring the pressure at the region of the sample which is at the membranes of the TEM holder, the system should more quickly detect a leak and react accordingly as described later.

FIG. 3g adds an interface controller with software as well as a communication and switching bus, such as manufactured by WAGO, to the system of FIG. 3f. The interface controller could be a personal computer with monitor. The communication and switching bus enables I/O communication from the pressure sensors, valves, vacuum pump and the controls software and the ability to change the state of a device. For example, this allows the software to command the valves to be opened or closed and monitor the states of all of these devices in order to make user demanded or programmed decisions. Although not shown in FIG. 3g, the communication and switching bus is connected to all of these components (e.g., sensors, valves, tanks, etc.) with the appropriate manufacturer recommended I/O cabling. It should be recognized by those skilled in the art that additional pressure sensors and valves and tanks (not shown) could provide additional functionality (for example, mixing). Moreover, other valves and pressure sensors are contemplated for use herein, as readily determined by the person skilled in the art.

Figure 4A:
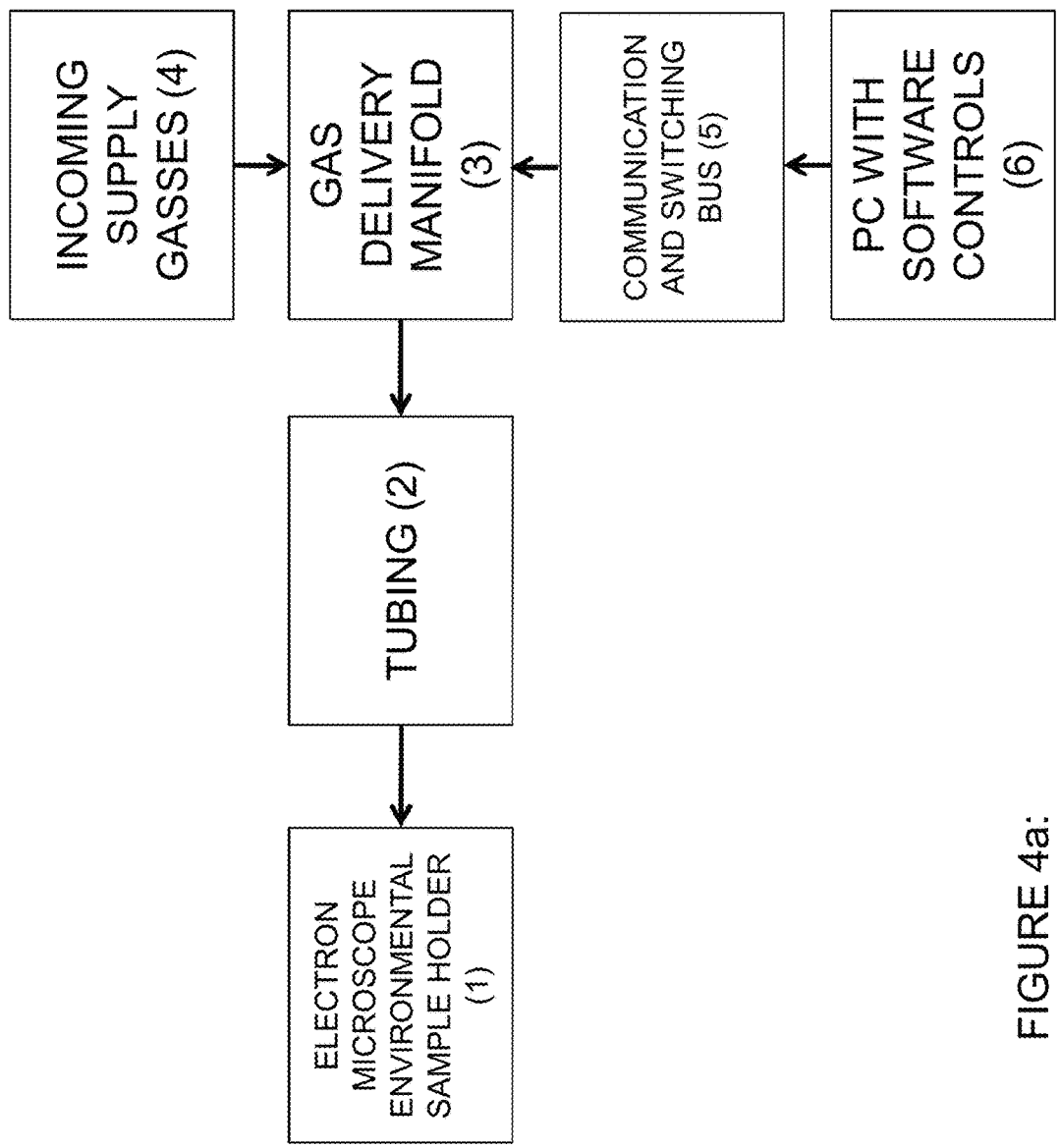
FIG. 4a is a block diagram of the system of FIGS. 3a-3g.
Figure 4B:
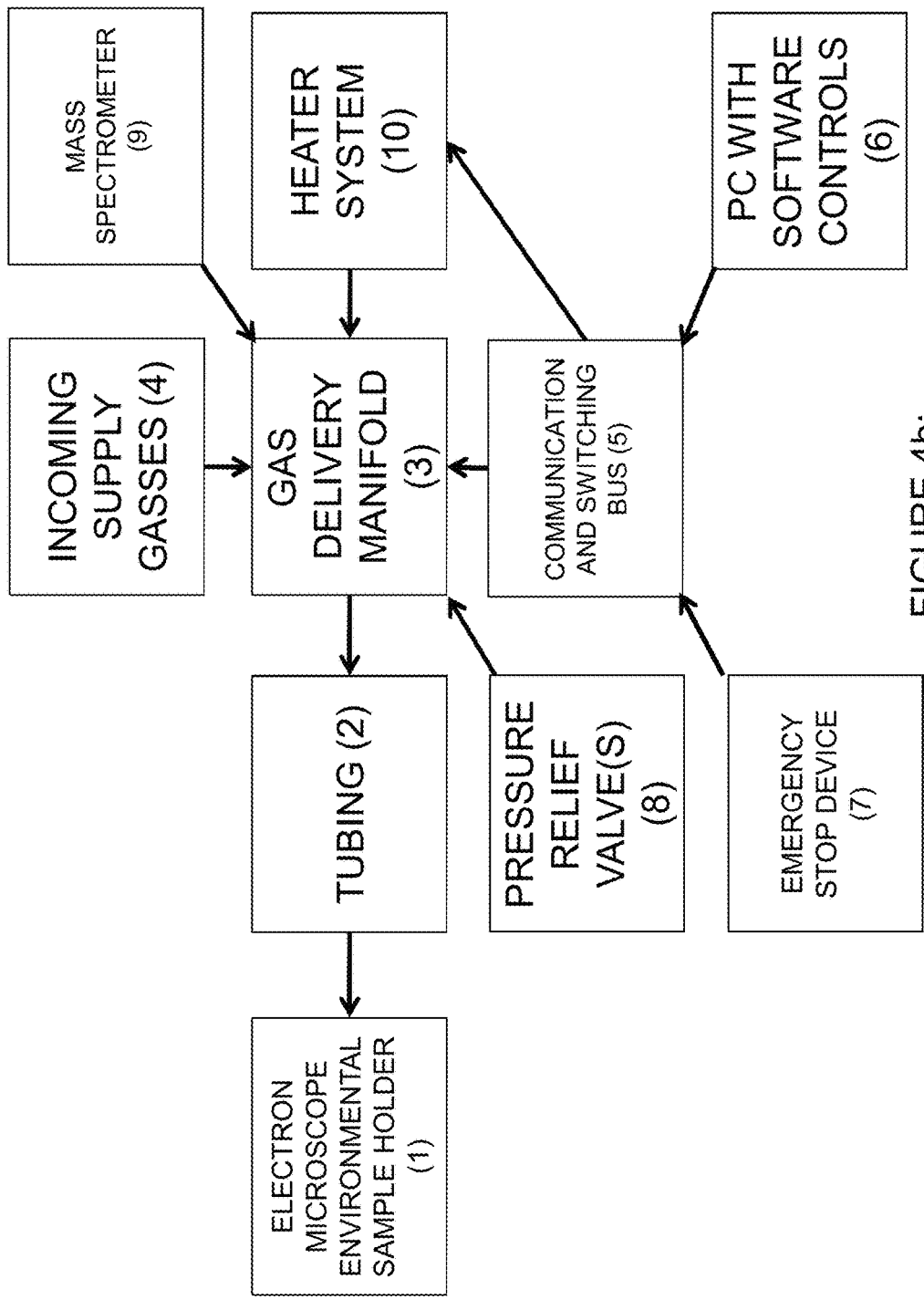
FIG. 4b is a block diagram of an advanced system.

FIG. 4a is a block diagram of the previously described system in block components 1-6. FIG. 4b is a block diagram of an advanced system. The advanced system combines additional components 7-10 for advanced functionality and/or safety.

A Mechanical Emergency Stop device (E-Stop) (7). If the E-Stop is activated, typically by pressing a red button, the power to the system, or parts of the system, is removed. E-Stops are commonly available through industrial supply stores such as Grainger, manufactured by companies such as Omron.

Pressure relief valve(s) (8) are commonly available through industrial supply stores and will vent gas out of a system if a pressure reaches a critical level. For example, if a pressure of 1000 Torr is expected to rupture a membrane in the TEM holder, a relief valve with a set point of 900 Torr and placed inline upstream from the TEM holder, preventing the membranes from reaching 1000 Torr.

A mass spectrometer (9) is a piece of instrumentation used to determine the elemental composition within a gas. This would be a useful component to use with this system. Users of this system want to fully understand the reaction of gasses and solids at the atomic level. This includes determining what the resultant gas composition is, after a reaction at the sample area has occurred, if at all. By flowing the gas that exits the holder into a mass spectrometer, the exact composition of the resultant gas can be analyzed and information about the gas—solid reaction can be established.

A heater system (10) can be added to any of the components in the system that encapsulate gas such as the tanks and tubing. Heating tape and heating wire can be placed on and/or around these components to raise the temperature of the surfaces that are in contact with the gas. The purpose of raising the temperature is to reduce the bond strength of contaminants that attach to these surfaces during operation. In combination with cycling a purge gas such as Nitrogen in and then removing the Nitrogen by driving the pressure to a low level, effective removal of contaminants can be achieved.

Multiple embodiments are described to show typical use cases on the system described herein in FIG. 3g, by way of example.

i) Use Case 1—Purge System—Before running a gas flow experiment, a typical use case will be to remove (purge) all of the gas from the system. To do this, valves V1, V2, VH and VP of the system of FIG. 3g are opened by the software controls (see, FIG. 5a). The vacuum pump will remove gas from the tubing and tanks and sample holder to a base vacuum level P1. For example, P1 could be in a range from about 0.01 to about 10 milliTorr, preferably about 1 milliTorr. Once sensors S1 and/or S2 and/or SH reach the P1 pressure, valves V1, V2, VH and VP will be closed by the software controls. At this point the system has been purged.

ii) Use Case 2—Backfill Tank 1—Next, Tank 1 needs to be filled with the experiment gas. For example, the user may want to run an experiment with Argon gas at 1500 Torr. Tank 3 contains Argon at a high pressure, e.g., greater than 1500 Torr. Valves V1 and V3 will open (see, e.g., FIG. 5*b*) allowing the gas from Tank 3 to fill Tank 1 until sensor S1 measures a preferred pressure, e.g., about 1500 Torr, at which point Valves V1 and V3 will close. At this point, tank 1 has been filled with the experiment gas to the required pressure.

iii) Use Case 3—Gas Flow Experiment—Next valves V1, VH and V2 open (see, FIG. 5*c*). Since, by way of example, the pressure in Tank 1 is at 1500 Torr and the pressure in Tank 2 is low, e.g., about 1 milliTorr, Argon gas will flow from Tank 1, through the TEM holder and into tank 2. When the user wants to stop the experiment, valves V1, V2 and VH will be closed.

iv) User Case 4—Static Gas Experiment—The end of use Case 3 is effectively a static gas experiment (see, FIG. 5*d*). Pressure sensor SH will monitor the pressure in the sample holder.

v) Use Case 5—Purge system. At the end of the experiment, the next step is to repeat Use Case 1, removing gases from the system (see, FIG. 5*e*).

vi) User Case 6—Backfill the system with Nitrogen. The system can now be brought back to its initial state. Tank 5 is filled with Nitrogen at a pressure at or higher than 760 Torr. By opening valves V1, V2, V5 and VH (see, FIG. 5*f*), Nitrogen will fill the system until Si and/or S2 and/or SH measure determine a desired purge pressure has been achieved. This would typically be atmospheric pressure. The purpose of using Nitrogen, or some other inert gas, is that it is a pure safe clean gas, desired when the system is not being used.

The aforementioned use cases are ideal. However, in the event of leaks or other malfunctioning equipment, automated processes need to be developed. The following multiple embodiments are associated with a method of safely controlling the containment of gas within a manifold system and delivering gas to a sample holder for an electron microscope.

a. Leak detection. Under the conditions of Use Case 4 above for example, all of the valves in the system are closed. The controls software (6) is programmed to monitor the pressure readings from the sensors S 1, S2 and SH, and in the event of a transient increase in pressure (i.e., a leak into the system) notify the user of the location and size of the leak. A leak into the system is highly undesirable as it will allow air to mix with the experiment gas.

b. Leaks into the electron microscope Under the conditions of Use Case 3 above, when the pressure of the electron microscope ($p_{EM}$) is less than the pressure of tank T1 ($p_{T1}$), which is less than atmospheric pressure ($p_{atm}$), pressure sensors S1, S2 and SH are monitoring the pressures in the system. The software controls (6) are programmed to react in the event of an electron microscope leak as follows. Electron microscope columns are maintained at pressures lower than any of the pressures in the described gas delivery system, with the possible exception of the pressure in Tank T2. Therefore, an unexpected decrease in pressure as determined by pressure sensors S1 and/or S2 and/or SH indicates a leak from the sample holder (1) into the Electron microscope. The pressure sensors S1 and/or S2 and/or SH will measure this pressure change and the software controls (6) will close all of the open valves to prevent additional gas from leaking into the microscope, thus minimizing damage to the microscope. Additionally, Valve VP may be temporarily opened to the Mechanical Vacuum Pump forcing the gas in the tubing to at least partially be evacuated by the Mechanical Vacuum Pump, further minimizing the amount of gas that is able to escape into the microscope. This will allow the user to safely shut down the microscope, remove the sample holder and repair the source of the leak. Furthermore, if the controls system is connected to the electron microscope system, it is possible to initiate safety controls on the microscope as well, such as closing the valve to the Field Emission Gun. While Use Case 1 was used to explain the safety controls, it should be appreciated that these controls will work for all possible use cases where a valve can be closed to prevent gas from entering the microscope in the event of a leak.

c. Leaks at pressures higher than atmospheric pressure Under the conditions of Use Case 4 above, when the pressure of the electron microscope ($p_{EM}$) is less than the pressure of tank T1 ($p_{T1}$), which is greater than atmospheric pressure ($p_{atm}$), pressure sensors S1, S2 and SH are monitoring the pressures in the system. The software controls (6) are programmed to react in the event of an environment leak as follows. In this example, Tank 1 can be at any pressure greater than atmospheric pressure, e.g., about 1500 Torr. Therefore, an unexpected decrease in pressure as determined by pressure sensors S1 and/or S2 and/or SH could indicate a leak into the environment. The pressure sensors S1 and/or S2 and/or SH will measure this pressure change and the software controls (6) will open valves V1, VP and VH to allow the vacuum pump to remove the gas from the system, preventing further escape into the atmosphere. This will allow the user to safely shut down the microscope, remove the sample holder and repair the source of the leak.

d. In any of the use cases, the software may lose partial communication with the system If software is not receiving the expected communication from the system, it will send a command to remove power from the valves. Since all of the valves in the system are normally closed, removing power will close any open valves. This could occur in the event of a software defect, operating system defect, computer malfunction or a cable break. All valves will remain closed until the software controls are functioning.

If software is not working properly or at all, for example it has crashed or is frozen up, it may not be possible for the user to determine if there is a leak in the system. In this event the user can activate the mechanical emergency stop device (E-Stop), as described above. Since all of the valves in the system are normally closed, the E-stop will stop power to these valves. All valves will remain closed until the software controls are functioning.

e. Mixing gases When mixing gases in the system is prohibited, safety controls to prevent mixing gases is important. In many cases, mixing dissimilar gases could be unsafe. For example, the resultant mixture could be toxic or volatile.

To prevent this, if a valve is commanded to open by the user, and it is between two areas of the system with dissimilar gases, the system will not open the valve. The need for this control could arise in the event of an operator error or a software defect. For example, the software may be written in a way to allow the user to freely control a valve to open or close. However, the software will recognize if the valve being opened will cause a safety issue and prevent it from occurring. In a similar scenario, if a valve opens between two containers with dissimilar gases, then the system will automatically shut the valve. The need for this control could arise, for example, in a failure of one or more electro-mechanical components.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A system comprising:
an electron microscope sample holder having a cell; and
a gas delivery system comprising:
    a gas source device configured for fluid communication with the cell;
    a gas destination device configured for fluid communication with the cell;
    a pressure sensor configured for fluid communication with at least one of the cell, the gas source device, and the gas destination device;
    at least one valve;
    an intermediary valve between the at least one valve and an inlet port; and
    a controller configured for monitoring the pressure sensor and signaling control of the valve.

2. The system of claim 1, further comprising a mass flow controller.

3. The system of claim 1, wherein the gas source device comprises a tank.

4. The system of claim 1, wherein the gas destination device comprises at least one of a tank and a pump.

5. The system of claim 1, wherein: the at least one valve closes when not electrically activated.

6. The system of claim 1, wherein the pressure sensor is between the gas source device and the at least one valve.

7. The system of claim 6, further comprising a second valve and a second pressure sensor, wherein a second pressure sensor is between the gas destination device and the second valve.

8. The system of claim 1, wherein upon a decrease in pressure at the at least one pressure sensor, the controller signals closure of the at least one valve.

9. The system of claim 1, wherein upon a decrease in pressure at the at least one pressure sensor or a second pressure sensor, the controller signals closure of the at least one valve or the intermediary valve to prevent leakage from the system into an atmosphere environment.

10. The system of claim 1, further comprising a communication and switching bus by which the controller commands the at least one valve to be opened or closed.

11. The system of claim 10, wherein: the at least one valve closes when not electrically-activated by the controller; and a second valve closes when not electrically-activated by the controller.

12. The system of claim 11, further comprising an emergency stop device, wherein: the at least one valve closes when not activated by electrical power; the second valve closes when not activated by electrical power; and electrical power is removed from the at least one valve and second valve when the emergency stop device is activated.

13. The system of claim 12, wherein upon an increase in pressure of at least one of the at least one pressure sensor, and a second pressure sensor, the controller signals closure of the at least one valve and a second valve to prevent leakage from an atmosphere into the system.

14. The system of claim 13, wherein upon a decrease in pressure of at least one of the at least one pressure sensor and the second pressure sensor, the controller signals closure of the at least one valve and the second valve to prevent leakage from the system into an electron microscope.

15. The system of claim 1, wherein the gas destination device comprises a pump.

* * * * *